US012732224B1

(12) United States Patent
Bai et al.

(10) Patent No.: US 12,732,224 B1
(45) Date of Patent: Sep. 8, 2026

(54) COMMON-MODE NOISE DETECTION AND CALIBRATION SYSTEM FOR HIGH-SPEED SERDES

(71) Applicant: Marvell Asia Pte Ltd, Singapore (SG)

(72) Inventors: Liming Bai, Shanghai (CN); Zhendong Guo, San Jose, CA (US); Yongxu Wang, Shanghai (CN); Guoping Cui, Newark, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 28 days.

(21) Appl. No.: 18/763,569

(22) Filed: Jul. 3, 2024

Related U.S. Application Data

(60) Provisional application No. 63/532,341, filed on Aug. 11, 2023.

(51) Int. Cl.
*H04B 1/40* (2015.01)
*H02M 1/12* (2006.01)
*H03F 3/45* (2006.01)

(52) U.S. Cl.
CPC .............. *H04B 1/40* (2013.01); *H02M 1/123* (2021.05); *H03F 3/45479* (2013.01); *H03F 3/45488* (2013.01)

(58) Field of Classification Search
CPC .. H04B 1/38; H04B 1/40; H02M 1/12; H02M 1/123; H02M 1/126; H03F 3/45; H03F 3/45479; H03F 3/45488; H03F 3/4552; H03F 3/45529; H03F 3/45748; H03H 7/427
USPC .... 375/219–221, 224, 297, 358; 327/52, 54, 327/65, 67, 89, 96; 330/85, 252, 330/258–261, 270, 271, 273, 290, 291, 330/296, 301, 305; 455/69
See application file for complete search history.

(56) References Cited

U.S. PATENT DOCUMENTS

| | | | | |
|---|---|---|---|---|
| 7,102,392 | B2 * | 9/2006 | Hsu | G01R 19/165 327/20 |
| 7,486,114 | B2 * | 2/2009 | Chen | H04L 25/0274 327/20 |
| 2019/0356282 | A1 * | 11/2019 | Froehlich | H03F 3/45941 |
| 2023/0353103 | A1 * | 11/2023 | Akter | H03F 3/45192 |
| 2024/0061070 | A1 * | 2/2024 | Zou | G01S 13/56 |

FOREIGN PATENT DOCUMENTS

CN 102457455 A * 5/2012

* cited by examiner

*Primary Examiner* — Young T. Tse

(57) ABSTRACT

A SERDES includes a transmitter configured to output a differential signal that is subject to common-mode noise, where the differential signal includes a digital signal and an inverted digital signal. The detector circuitry is configured to derive an amplified and biased common-mode signal from the differential signal, and the transmitter is further configured to tune the digital signal responsively to feedback based on the amplified and biased common-mode signal to reduce electromagnetic interference of the common-mode noise. Such a SERDES may include feedback circuitry which configured to receive the amplified and biased common-mode signal and to convert the amplified and biased common-mode signal into a feedback signal, and the transmitter may be further configured to receive the feedback signal for tuning the digital signal based on the feedback signal.

22 Claims, 7 Drawing Sheets

COMMON-MODE NOISE DETECTION AND CALIBRATION SYSTEM FOR HIGH-SPEED SERDES

CROSS REFERENCE TO RELATED APPLICATION

This disclosure claims the benefit of commonly-assigned U.S. Provisional Patent Application No. 63/532,341, filed Aug. 11, 2023, which is hereby incorporated by reference herein in its entirety.

FIELD OF USE

This disclosure relates to a high-speed serializer/deserializer (SERDES). More particularly, this disclosure relates to a high-speed SERDES with improved resilience to common-mode noise interference.

BACKGROUND

The background description provided herein is for the purpose of generally presenting the context of the disclosure. Work of the inventors hereof, to the extent that that work is described in this background section, as well as aspects of the description that may not otherwise qualify as prior art at the time of filing, are neither expressly nor impliedly admitted to be prior art against the subject matter of the present disclosure.

A differential signal is a signal which includes a positive leg and a negative leg, which are complementary signals. The signals on each leg are equal in magnitude but opposite in polarity. Common-mode noise in a differential signal is signal noise which impacts both signal legs of the differential signal. Common-mode noise can result from a mismatch in rise/fall time in the differential signal or from external sources such as electromagnetic interference (EMI).

The impact of common-mode noise is the worst at twice the Nyquist frequency. The Nyquist frequency is half of the sampling rate of a digital signal (i.e., the impact of common-mode noise is worst at the sampling rate).

SUMMARY

In accordance with implementations of the subject matter of this disclosure, a SERDES includes a transmitter configured to output a differential signal that is subject to common-mode noise, where the differential signal includes a digital signal and an inverted digital signal, detector circuitry configured to derive an amplified and biased common-mode signal from the differential signal, and the transmitter is further configured to tune the digital signal responsively to feedback based on the amplified and biased common-mode signal to reduce electromagnetic interference of the common-mode noise.

A first implementation of such a SERDES may further include feedback circuitry configured to receive the amplified and biased common-mode signal, and convert the amplified and biased common-mode signal into a feedback signal and the transmitter may be further configured to receive the feedback signal for tuning the digital signal based on the feedback signal.

In a second implementation of such a SERDES, the detector circuitry may further include circuitry configured to derive a common-mode signal from the differential signal.

According to a first aspect of that second implementation, the circuitry configured to derive the common-mode signal from the differential signal may be configured to convert the digital signal into an alternating current (AC) signal, may convert the inverted digital signal into an inverted AC signal, and may combine the AC signal and the inverted AC signal.

According to a second aspect of that second implementation, the detector circuitry may further include amplifier circuitry configured to amplify the derived common-mode signal.

According to a first instance of that second aspect, the amplifier circuitry may be further configured to amplify the derived common-mode signal by applying a current source to the derived common-mode signal.

According to a second instance of that second aspect, the detector circuitry may further include biasing circuitry configured to selectively bias the amplified derived common-mode signal by detecting a first voltage of the amplified derived common-mode signal and, in response to detecting that the first voltage is above a threshold, bias the first voltage towards ground.

According to a first variation of that second instance, the detector circuitry may further include biasing circuitry further configured to selectively bias the amplified derived common-mode signal by detecting a second voltage of the amplified derived common-mode signal and, in response to detecting that the second voltage is below a threshold, outputting the second voltage.

According to a first alternative of that first variation, the feedback circuitry may include a low pass filter configured to filter the output of the detector circuitry to remove the second voltage.

According to a first variant of that first alternative, the feedback circuitry may further include an analog-to-digital converter (ADC) configured to convert the filtered output signal into the digital feedback signal.

According to a second variation of that second instance, the biasing circuitry may be further configured to detect the first voltage of the amplified derived common-mode signal by detecting a peak-to-peak voltage value.

In accordance with implementations of the subject matter of this disclosure, a method, for reducing common-mode noise in a differential signal of a SERDES, includes outputting, by a transmitter, a differential signal that is subject to common-mode noise, wherein the differential signal comprises a digital signal and an inverted digital signal, deriving an amplified and biased common-mode signal from the differential signal, and tuning, by the transmitter, the digital signal responsively to feedback based on the amplified and biased common-mode signal to reduce electromagnetic interference of the common-mode noise.

A first implementation of such a method may further include converting the amplified and biased common-mode signal into a feedback signal.

A second implementation of such a method may further include deriving an amplified and biased common-mode signal from the differential signal by deriving a common-mode signal from the differential signal.

A first aspect of that second implementation may further include deriving a common-mode signal from the differential signal by converting the digital signal into an alternating current (AC) signal, converting the inverted digital signal into an inverted AC signal, and combining the AC signal and the inverted AC signal.

A second aspect of that second implementation may further include deriving an amplified and biased common-mode signal from the differential signal by amplifying the derived common-mode signal.

A first instance of that second aspect may further include amplifying the common-mode signal by applying a current source to the common-mode signal.

A second instance of that second aspect may further include deriving an amplified and biased derived common-mode signal from the differential signal by detecting a first voltage of the amplified derived common-mode signal, and in response to detecting that the first voltage is above a threshold, biasing the first voltage towards ground.

A first variation of that second instance may further include detecting the first voltage of the amplified common-mode signal by detecting a peak-to-peak voltage value.

A third instance of that second aspect may further include deriving an amplified and biased derived common-mode signal from the differential signal by detecting a second voltage of the amplified derived common-mode signal, and in response to detecting that the second voltage is below a threshold, outputting the second voltage.

A first variation of that third instance may further include filtering, by a low-pass filter, the output of the detector circuitry to remove the second voltage.

A first alternative of that first variation may further include converting, by an ADC, the filtered output signal into the digital feedback signal.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

In a high-speed SERDES system, common-mode noise causes an imbalance between positive and negative legs of a differential signal. This common-mode noise can cause radiation at twice the Nyquist frequency which in turn causes degradation of the performance of other circuits. Therefore, reduction of common-mode noise can improve circuit performance despite electromagnetic interference. Detection of common-mode noise is a prerequisite for reduction of the common-mode noise. However, in high-speed systems, because the common-mode noise frequency is twice the Nyquist frequency, the frequency of the common-mode noise is very high. It is difficult to detect common mode noise in a high frequency signal because the common mode noise can blend in with the desired signal and make it difficult to distinguish between noise and the actual signal.

In order to distinguish the common mode noise from the desired signal, some systems may use differential probes to detect the common mode noise. Differential probes detect common mode noise by measuring the voltage between each signal line and a common reference point. However, differential probes have a specific operating bandwidth, and performance degrades beyond that bandwidth. At extremely high frequencies, the differential probes may not actually capture the signal.

Systems and methods for reducing common-mode noise in a differential signal of a high speed SERDES are provided according to implementations of the subject matter of this disclosure.

A common-mode noise detector and calibration system is provided which receives a differential signal and detects common-mode noise in the differential signal.

The system detects the common-mode noise through two stages—an amplification stage and a common source stage. At the amplification stage, the common-mode noise detector amplifies the common-mode noise signal to make it easier to distinguish the common-mode noise and its signal properties. At the common source stage, the common-mode noise detector selectively biases the amplified common-mode signal. When the voltage of the amplified common-mode signal is above a threshold, the detector biases the voltage to ground. When the voltage of the amplified common-mode signal is below a threshold, the detector outputs the voltage. This allows the detector to output only the noise signal at lower voltages which thereby isolates the common-mode noise.

The selectively biased signal is then input to a low-pass filter. The low-pass filter filters the signal, passing only the low voltages of the signal to an analog-to-digital converter (ADC). The ADC then converts the filtered signal into a digital feedback signal. The digital feedback signal is then conducted to the transmitter which tunes the differential signal based on the digital feedback signal.

The subject matter of this disclosure may be better understood by reference to FIGS. 1-7.

Figure 1:
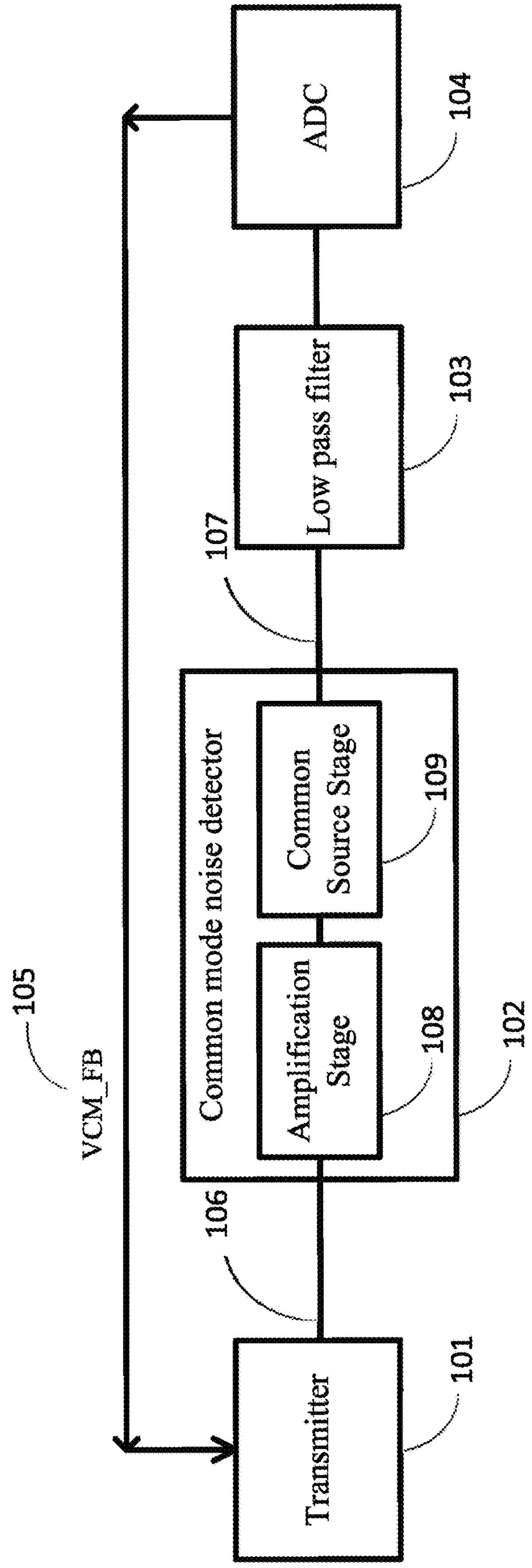
FIG. 1 illustrates a common-mode noise detector, and calibration system, in accordance with implementations of the subject matter of this disclosure.

FIG. 1 illustrates common-mode noise detector and calibration system 100 in accordance with implementations of the subject matter of this disclosure. This illustration is provided in the context of a differential transmitter circuit.

Transmitter 101 outputs differential signal 106, which is input to common-mode noise detector 102. Common-mode noise detector 102 receives differential signal 106 and derives a common-mode noise signal by summing the positive leg and negative leg of differential signal 106. Amplification stage 108 of common-mode noise detector 102 amplifies the derived common-mode noise signal. Common source stage 109 of common-mode noise detector 102 then selectively biases the amplified common-mode noise signal. When the voltage of the amplified common-mode signal is high, the detector biases the voltage to ground. When the voltage of the amplified common-mode signal is low, the detector outputs the voltage. Thus the high common-mode noise is biased to a low voltage and the rest of the signal is output normally. Thus, common-mode noise detector 102 derives a selectively biased and amplified common-mode noise signal 107.

In some implementations, common-mode noise detector 102 may be the common-mode noise detector 300 described below in connection with FIG. 3. In some other implementations, common-mode noise detector 102 may be common-mode noise detector 400 discussed below in connection with FIG. 4.

Common-mode noise detector 102 outputs selectively biased and amplified common-mode noise signal 107 to low pass filter 103 which passes only low voltages to ADC 104. As a result, the high common-mode noise which was biased to a low voltage by common-mode noise detector 102 is allowed through while the rest of the signal, above the low-pass threshold, is filtered out. ADC 104 converts the signal into digital feedback signal VCM_FB 105. Digital feedback signal VCM_FB 105, which indicates where the common-mode noise exists in the original differential signal, is fed back to transmitter 101. Transmitter 101 may then tune the differential signal based on digital feedback signal VCM_FB 105 to reduce the common-mode noise.

Figure 2:
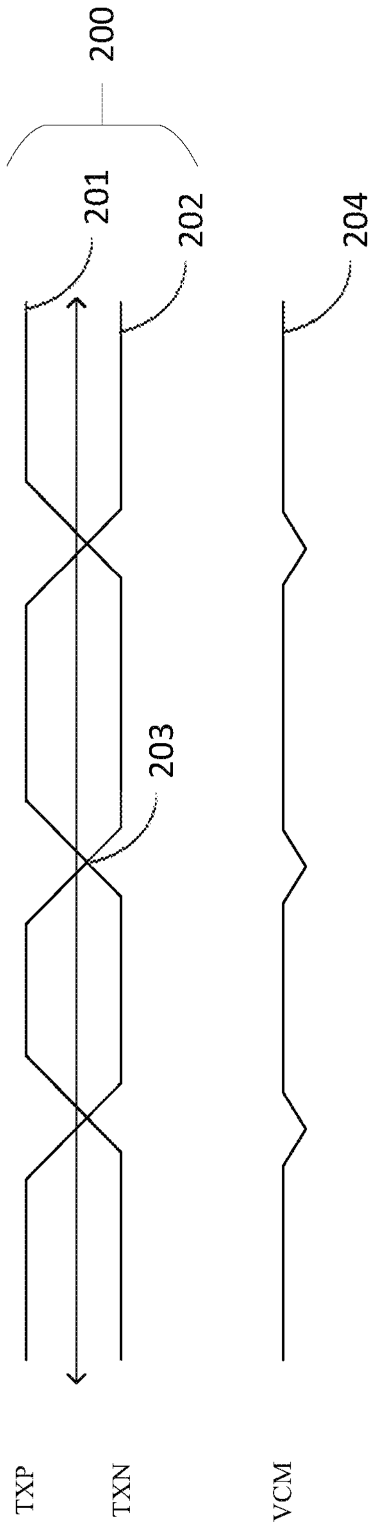
FIG. 2 illustrates a differential signal and a common-mode noise signal.

As seen in FIG. 2, differential signal 200 includes positive leg 201 and negative leg 202. In a differential signal with no common-mode noise, the intersection of the two signals would occur at zero voltage because positive leg 201 and negative leg 202 would be inverses of each other. However, when differential signal 200 is subject to common-mode noise, intersection 203 is offset from zero voltage.

Common-mode noise voltage signal VCM 204 is the sum of positive leg 201 and negative leg 202 of differential signal 200. In a differential signal with no common-mode noise, VCM 204 would always be zero because positive leg 201 and negative leg 202 would be inverses of each other. However, differential signal 200 is subject to common-mode noise and therefore VCM 204 contains nonzero voltages.

Figure 3:
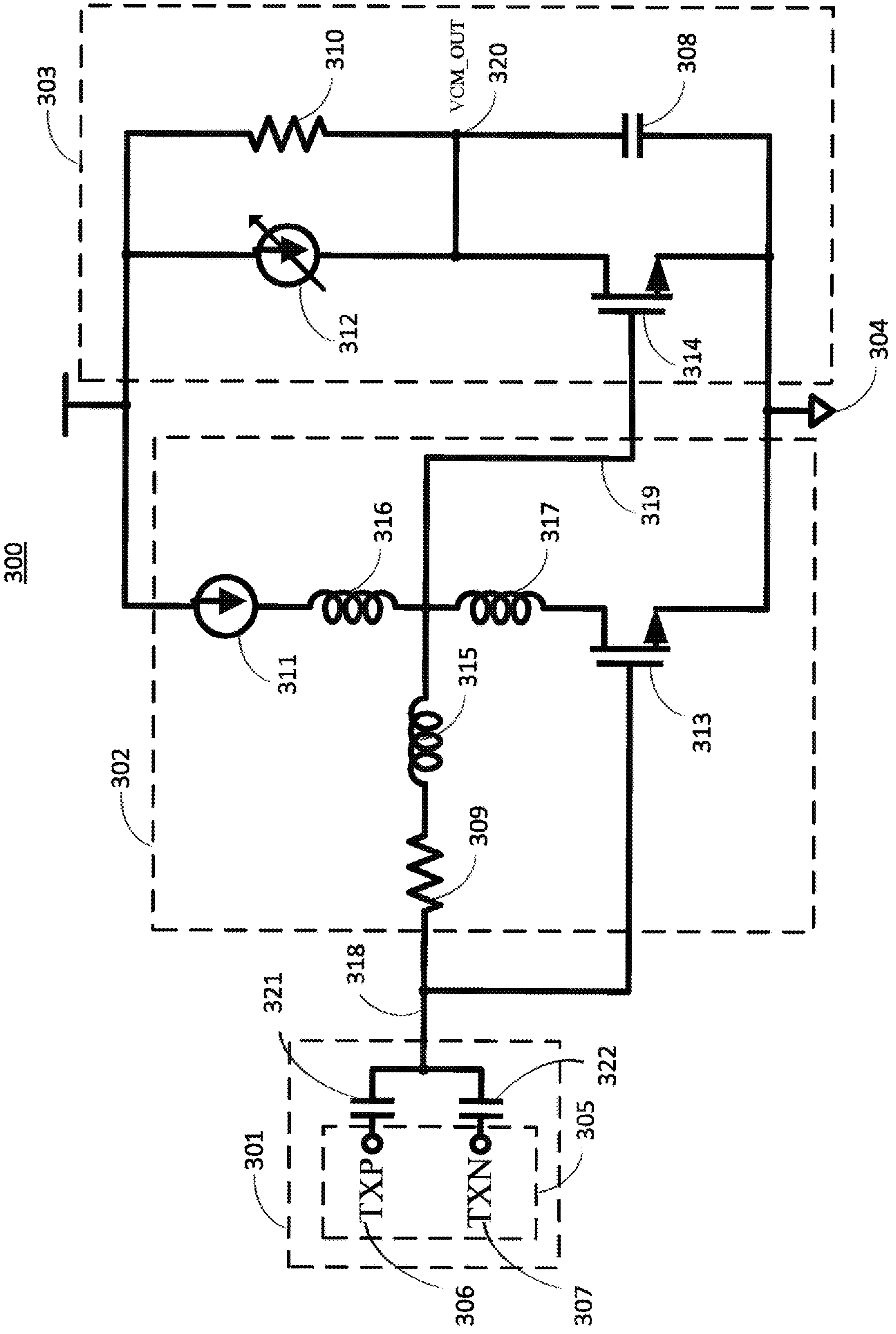
FIG. 3 illustrates a common-mode noise detector, in accordance with implementations of the subject matter of this disclosure.

As illustrated in FIG. 3, common-mode noise detector 300 in accordance with implementations of the subject matter of this disclosure includes input network 301 which receives a digital differential signal 305 including a positive leg and negative leg. In some implementations, this differential signal may come from a transmitter. In such implementations, the positive leg of differential signal 305 is TXP 306 and the negative leg of differential signal 305 is TXN 307. Positive leg TXP 306 of the digital differential signal 305 is received at capacitor 321 and the negative inverted leg TXN 307 of the differential signal 305 is received at capacitor 322. Capacitors 321 and 322 block direct current (DC) from differential signal 305 while allowing the alternating current (AC) portion of differential signal 305 signal to pass through. Capacitors 321 and 322 are coupled in parallel to output a combination analog signal derived from the positive and negative legs (TXP 306 and TXN 307) of differential signal 305—i.e., an analog common-mode noise signal 318 which is a sum of the legs of differential signal 305.

Input network 301 outputs that analog common-mode noise signal 318 to amplification stage 302. A biasing current of transistor 313 is set by current source 311. Resistor 309 self-biases the gate voltage of transistor 313. By biasing the gate voltage of transistor 313, current source 311 and resistor 309 adjust the gate voltage of transistor 313 into a "linear" or "active" region to allow transistor 313 to act as an amplifier. In this region, small changes to the gate voltage result in proportional changes in the current flowing through the channel between the source and drain terminals of transistor 313 and thus amplify the signal. In some implementations, inductors 315, 316, and 317 may be added. Inductors 315, 316, and 317 further boost the bandwidth of the amplification stage by matching impedance between the input to amplification stage 302, analog common-mode noise signal 319, and output of the amplification stage, amplified common-mode noise signal 319, and the components of amplification stage 302. Inductors 316 and 317 are electromagnetically coupled, which boosts this impedance matching. The degree of coupling is measured by coupling coefficient K1.

Amplification stage 302 outputs the amplified common-mode noise signal 319 to common source stage 303. Common source stage 303 amplifies the voltage difference between the amplified common-mode noise signal and the common reference point ground 304 and therefore refines the non-common-mode noise portion of the signal, as follows.

A biasing current of transistor 314 is set by current source 312. In some embodiments, current source 312 is lowered to set the proper operating point for transistor 314. Resistor 310 self-biases the gate voltage of transistor 314. By biasing the gate voltage of transistor 314, current source 312 and resistor 310 adjust the gate voltage of transistor 314 outside its "linear" or "active" region and instead in its "cut-off" or "saturation" regions to allow transistor 313 to act as a switch. In its "cut-off" region, transistor 314 is essentially off and there is minimal to no current flow between the source and drain terminals in transistor 314, thus opening the switch. In its "saturation" region, transistor 314 is essentially on and there is a maximum current flow between the source and drain terminals in transistor 314, thus closing the switch.

Because the common-mode noise to be filtered has a low voltage, transistor 314 blocks flow of current when the amplified common-mode noise signal 319 has a high peak-to-peak voltage. Therefore, high-voltage values are biased to ground 304. Transistor 314 allows the flow of current when the amplified common-mode noise signal 319 has a low peak-to-peak voltage. Therefore, low-voltage values are output at VCM_OUT 320, which could be common-mode noise signal 107 described in connection with FIG. 1, by common source stage 303. VCM_OUT 320 may be output to a low-pass filter, which could be low-pass filter 103 described in connection with FIG. 1. Filtered VCM_OUT 320 may be sent to an ADC, which may be ADC 104 described in connection with FIG. 1. VCM_OUT 320 is output to the source of differential signal 305, which may be transmitter 101 described in connection with FIG. 1, to be used by the source of differential signal 305 to filter the common-mode noise out of differential signal 305. In some implementations, converted and filtered VCM_OUT 320 may be VCM_FB 105 described in connection with FIG. 1

In some implementations, capacitor 308 is added to common source stage 303. Capacitor 308 filters high frequency ripple—i.e., fluctuations in the signal's amplitude over time—out of the signal output by transistor 314 by controlling the time it takes for transistor 314 to switch on and off. This further refines amplified common-mode noise signal 319. Without filtering for the ripple, VCM_OUT 320 would experience ripple fluctuations, which would reduce its precision as a common-mode noise signal.

Figure 4:
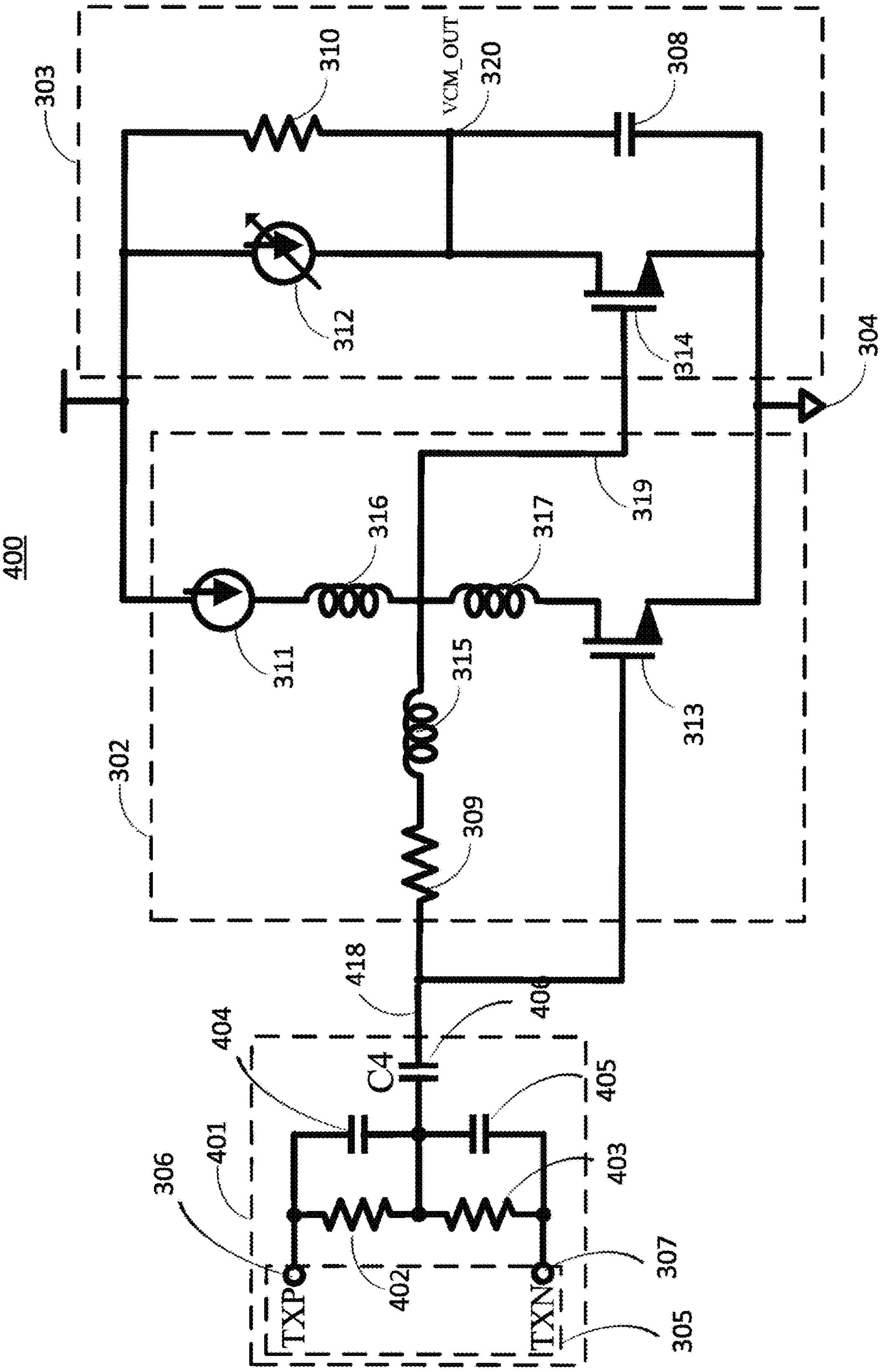
FIG. 4 illustrates a common-mode noise detector, and an input system, in accordance with implementations of the subject matter of this disclosure.

A common-mode noise detector 400 in accordance with other implementations of the subject matter of this disclosure, as illustrated in FIG. 4, includes input network 401 which receives a digital differential signal 305 having positive and negative legs (TXP 306 and TXN 307). The additional resistors and capacitor present in input network 401, but not in input network 301 of FIG. 3, allow for more accurate summing and attenuation of positive and negative legs (TXP 306 and TXN 307) to derive the analog common-mode signal 418.

The positive leg (TXP) 306 of the digital differential signal 305 is received by capacitor 404 and resistor 402 in parallel and the negative leg (TXN) 307 of the digital differential signal 305 is received by capacitor 405 and resistor 403 in parallel. Input network 401 is arranged in a summing configuration with resistor 402 and capacitor 404 in parallel and resistor 403 and capacitor 405 in parallel to accurately add TXP and TXN of the differential signal. Capacitor 406 acts as an AC coupling cap to block direct current (DC) from the differential signal while allowing alternating current (AC) signal to pass through.

Input network 401 outputs analog common-mode noise signal 418 to amplification stage 302, which operates in the same way as discussed in connection with FIG. 3 but starting with a more refined input common-mode noise signal 418. Analog common-mode noise signal 418 is a more accurate summing and attenuation of the positive and negative legs (TXP 306 and TXN 307) than analog common-mode noise signal 318 generated by input network 301 discussed in connection with FIG. 3.

Figure 5:
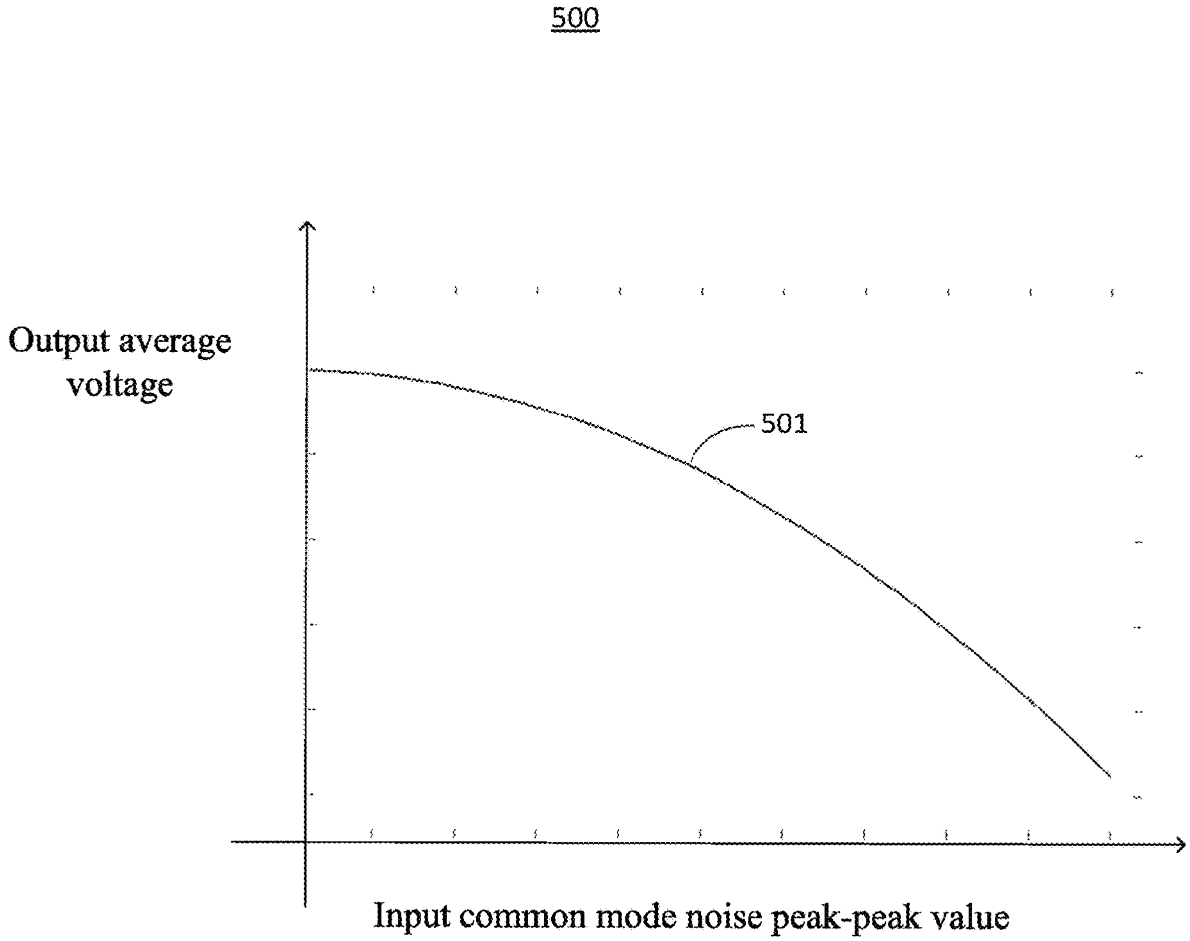
FIG. 5 illustrates a transfer function of a common-mode noise detector, in accordance with implementations of the subject matter of this disclosure.

FIG. 5 illustrates transfer function graph 500 of a common-mode noise detector, in accordance with the subject matter of this disclosure. In some implementations, transfer function 500 may represent the output function of amplification stage 302 and common source stage 303 discussed in connection with FIG. 3. A common-mode noise detector receives a differential signal at an input network. In some implementations, the input network is input network 301 discussed in connection with FIG. 3. In other implementations, the input network is input network 401 discussed in connection with FIG. 4. The input network then outputs an analog common-mode noise signal. In some implementations, the analog common-mode noise signal is analog common-mode noise signal 318 discussed in connection with FIG. 3. In some implementations, the analog common-mode noise signal is analog common-mode noise signal 418 discussed in connection with FIG. 4.

The x-axis of transfer function graph 500 represents the peak-to-peak value of the voltage of the common-mode noise signal, which is the difference between the most positive and most negative voltage of the signal. In some implementations, transfer function 501 is VCM_OUT output by common source stage 303 in FIG. 3.

The y-axis of transfer function graph 500 represents the output voltage of the common-mode noise detector. Transfer function 501 shows that when the peak-to-peak value of the voltage of the common-mode noise signal is high, the common-mode noise detector biases the output voltage down towards ground. When the peak-to-peak value of the voltage of the common-mode noise signal is low, the common-mode noise detector outputs the voltage at its peak.

Figure 6:
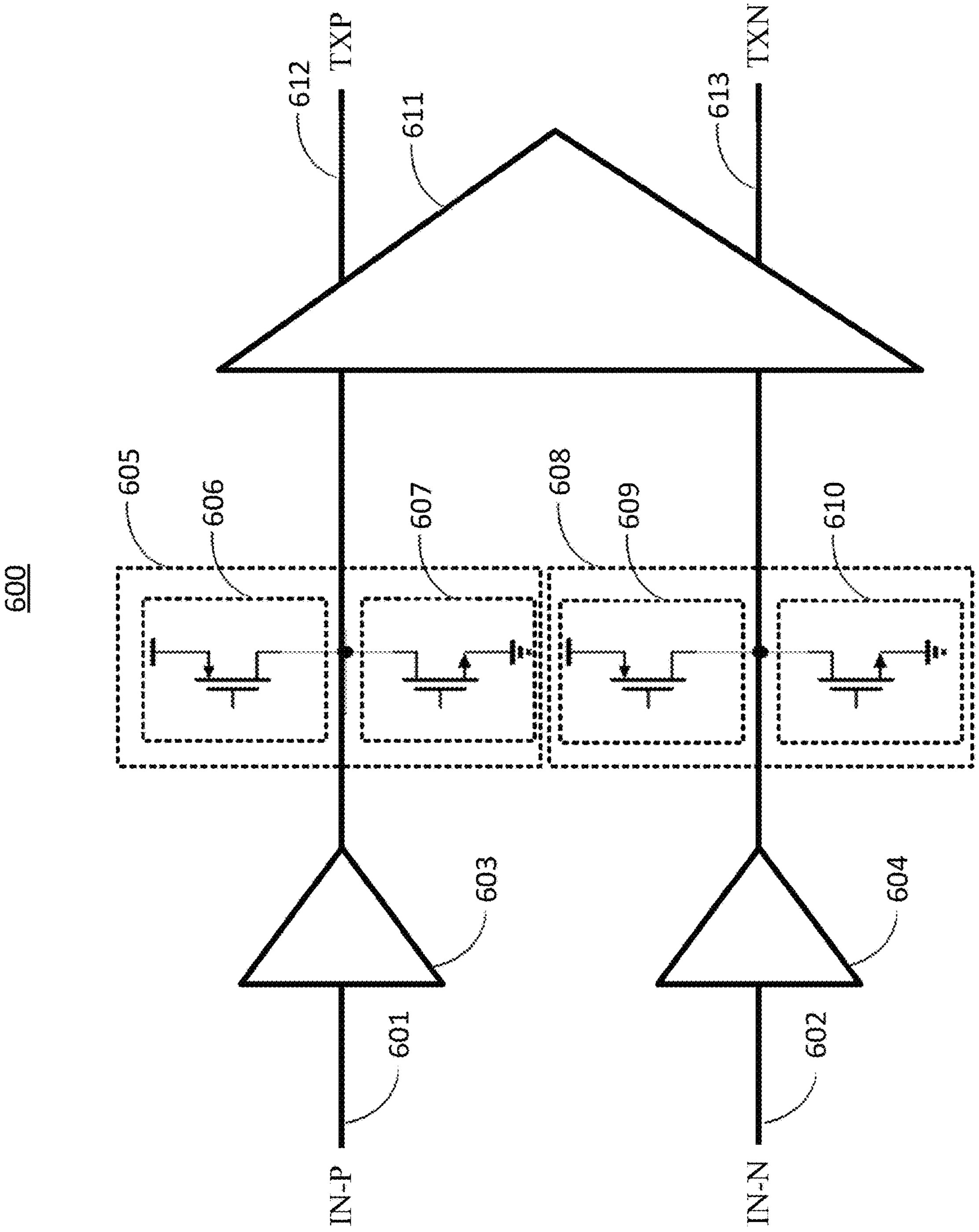
FIG. 6 illustrates an adjustment circuit which utilizes the feedback signal to tune the differential signal to remove EMI, in accordance with implementations of the subject matter of this disclosure.

FIG. 6 illustrates adjustment circuit 600 which utilizes the feedback signal to tune the differential signal to remove EMI, in accordance with implementations of the subject matter of this disclosure.

Tuning circuit 600 receives the positive leg of the differential signal at 601 and the negative leg of the differential signal at 602. The positive leg of the differential signal is amplified by amplifier 603 and the negative leg of the differential signal is amplified by amplifier 604.

Adjustment circuit 605 and adjustment circuit 608 receive a feedback signal from a common-mode noise detector. For example, the feedback signal may be digital feedback signal VCM_FB 105 discussed in connection with FIG. 1.

Based on the received feedback, pull-up network 606 of adjustment circuit 605 biases the positive leg of the differential signal and the pull-down network 607 of adjustment circuit 605 biases the positive leg of the differential signal.

Based on the received feedback, pull-up network 609 of adjustment circuit 608 will bias the positive leg of the differential signal and the pull-down network 610 of adjustment circuit 608 will bias the positive leg of the differential signal.

Each of the biased signals are amplified by amplifier 611. The positive leg of the corrected signal is output at 612 while the negative leg of the corrected signal is output at 613.

Figure 7:
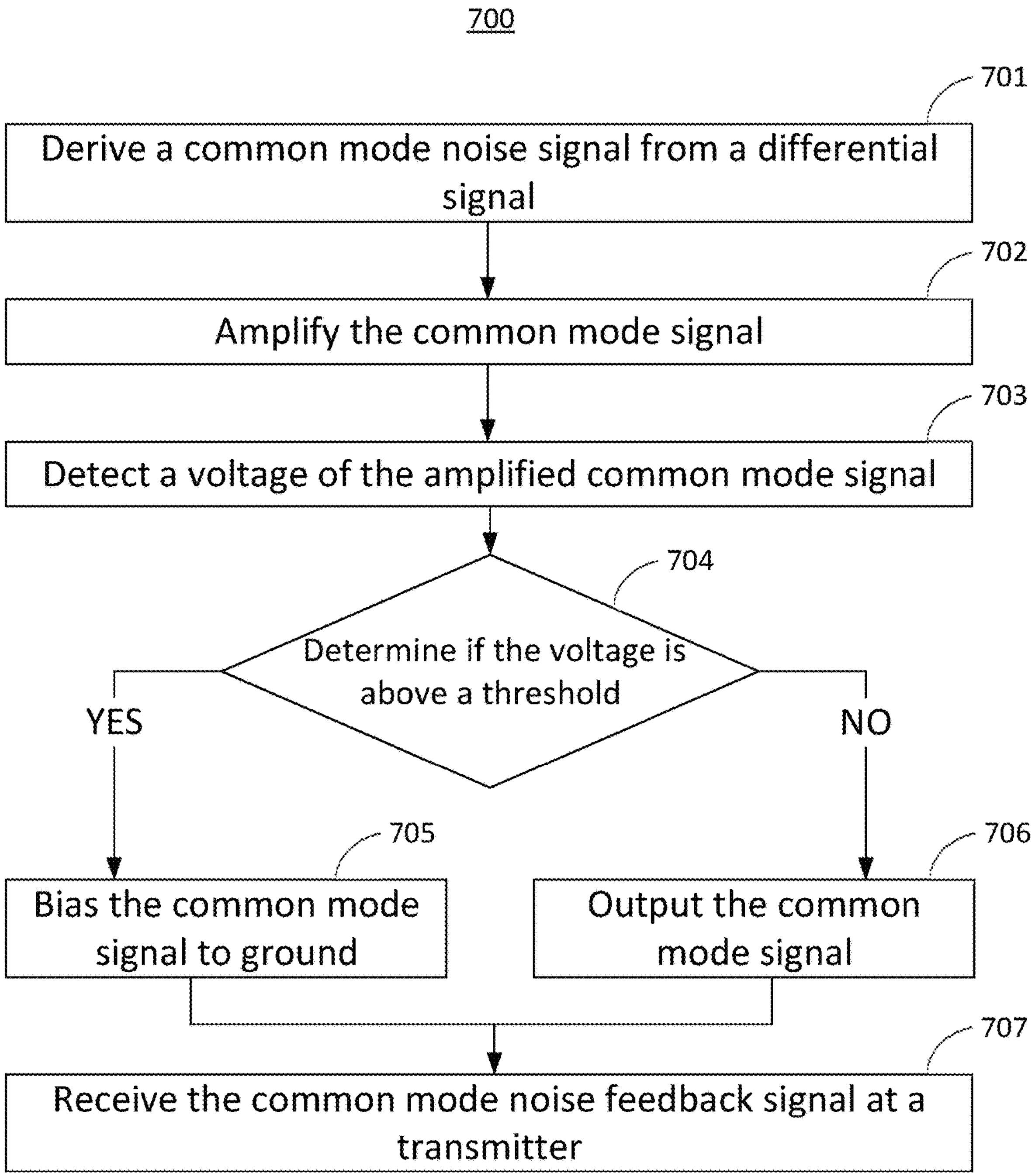
FIG. 7 is a flow diagram illustrating a method for common-mode noise detection, according to implementations of the subject matter of this disclosure.

FIG. 7 is a flow diagram illustrating a method 700 for common-mode noise detection, according to implementations of the subject matter of this disclosure.

At 701, a common-mode noise detector receives a differential signal and derives a common-mode signal. In some implementations, the common-mode noise detector utilizes an input network to derive the common-mode noise signal. In some implementations, the input network is input network 301 discussed in connection with FIG. 3. In some implementations, the input network is input network 401 discussed in connection with FIG. 4.

At 702, the common-mode noise detector amplifies the common-mode signal. In some implementations, the common-mode noise detector may use amplification stage 302 discussed in connection with FIG. 3.

At 703, the common-mode noise detector detects the voltage of the amplified common-mode signal. At 704, the common-mode noise detector determines if the voltage is above a threshold. If the voltage is above the threshold, then at 705 the common-mode noise detector biases the common-mode signal to ground. If the voltage is below the threshold, then at 706 the common-mode noise detector outputs the common-mode signal. In some implementations, this selective biasing is performed by common source stage 303 discussed in connection with FIG. 3. At 707, the common-mode noise detector outputs a common-mode noise feedback signal to a transmitter to correct the differential signal for common-mode noise.

Thus it is seen that systems and methods for reducing common-mode noise in a differential signal of a high speed SERDES have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A common-mode noise detection and calibration system for a high-speed serializer/deserializer (SERDES), the system comprising:

a transmitter configured to output a differential signal that is subject to common-mode noise, wherein the differential signal comprises a digital signal and an inverted digital signal; and detector circuitry configured to derive an amplified and biased common-mode signal from the differential signal, wherein, the transmitter is further configured to tune the digital signal responsively to feedback based on the amplified and biased common-mode signal to reduce electromagnetic interference of the common-mode noise.

2. The system of claim 1 further comprising a feedback loop configured to:

receive the amplified and biased common-mode signal; and convert the amplified and biased common-mode signal into a feedback signal, wherein, the transmitter is further configured to receive the feedback signal, for tuning the digital signal based on the feedback signal.

3. The system of claim 1 wherein the detector circuitry comprises circuitry configured to derive a common-mode signal from the differential signal.

4. The system of claim 3 wherein the circuitry configured to derive the common-mode signal from the differential signal is configured to:

convert the digital signal into an alternating current (AC) signal;

convert the inverted digital signal into an inverted AC signal; and combine the AC signal and the inverted AC signal.

5. The system of claim 3 wherein the detector circuitry further comprises amplifier circuitry configured to amplify the derived common-mode signal.

6. The system of claim 5 wherein the amplifier circuitry is further configured to amplify the derived common-mode signal by applying a current source to the derived common-mode signal.

7. The system of claim 5 wherein the detector circuitry further comprises biasing circuitry configured to selectively bias the amplified derived common-mode signal by:

detecting a first voltage of the amplified derived common-mode signal; and in response to detecting that the first voltage is above a threshold, biasing the first voltage towards ground.

8. The system of claim 7 wherein the biasing circuitry further configured to selectively bias the amplified derived common-mode signal by:

detecting a second voltage of the amplified derived common-mode signal; and in response to detecting that the second voltage is below the threshold, outputting the second voltage.

9. The system of claim 8 wherein the system further comprises a low-pass filter configured to filter an output of the detector circuitry to remove the second voltage.

10. The system of claim 9 wherein the system further comprises an analog-to-digital converter (ADC) configured to convert an output of the low-pass filter into the digital signal.

11. The system of claim 7 wherein the biasing circuitry is further configured to detect the first voltage of the amplified derived common-mode signal by detecting a peak-to-peak voltage value.

12. A method for reducing common-mode noise in a differential signal of a high-speed serializer/deserializer (SERDES), the method comprising:

outputting, by a transmitter, the differential signal that is subject to the common-mode noise, wherein the differential signal comprises a digital signal and an inverted digital signal;

deriving, by detector circuitry, an amplified and biased common-mode signal from the differential signal; and tuning, by the transmitter, the digital signal responsively to feedback based on the amplified and biased common-mode signal to reduce electromagnetic interference of the common-mode noise.

13. The method according to claim 12, the method further comprising converting the amplified and biased common-mode signal into a feedback signal.

14. The method according to claim 12, the method further comprising deriving the amplified and biased common-mode signal from the differential signal by deriving a common-mode signal from the differential signal.

15. The method according to claim 14, the method further comprising deriving the common-mode signal from the differential signal by:

converting the digital signal into an alternating current (AC) signal;

converting the inverted digital signal into an inverted AC signal; and combining the AC signal and the inverted AC signal.

16. The method according to claim 14, the method further comprising deriving the amplified and biased common-mode signal from the differential signal by amplifying the derived common-mode signal.

17. The method according to claim 16, the method further comprising amplifying the common-mode signal by applying a current source to the common-mode signal.

18. The method according to claim 16, the method further comprising selectively biasing the amplified derived common-mode signal by:

detecting a first voltage of the amplified derived common-mode signal; and in response to detecting that the first voltage is above a threshold, biasing the first voltage towards ground.

19. The method according to claim 18, the method further comprising detecting the first voltage of the amplified derived common-mode signal by detecting a peak-to-peak voltage value.

20. The method according to claim 18, the method further comprising selectively biasing the amplified derived common-mode signal by:

detecting a second voltage of the amplified derived common-mode signal; and in response to detecting that the second voltage is below the threshold, outputting the second voltage.

21. The method according to claim 20, the method further comprising filtering, by a low-pass filter, an output of the detector circuitry to remove the second voltage.

22. The method according to claim 21, the method further comprising converting, by an ADC, an output of the low-pass filter into the digital signal.

* * * * *